United States Patent
Cao (10) Patent No.: US 9,960,590 B1
(45) Date of Patent: May 1, 2018

(54) DC VOLTAGE CONVERSION CIRCUIT AND LIQUID CRYSTAL DISPLAY DEVICE INCLUDING THE SAME

(71) Applicant: Shenzhen China Star Optoelectronics Technology Co., Ltd., Shenzhen, Guangdong (CN)

(72) Inventor: Dan Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 81 days.

(21) Appl. No.: 15/128,987

(22) PCT Filed: Jun. 22, 2016

(86) PCT No.: PCT/CN2016/086785
§ 371 (c)(1),
(2) Date: Sep. 25, 2016

(87) PCT Pub. No.: WO2017/201786
PCT Pub. Date: Nov. 30, 2017

(30) Foreign Application Priority Data

May 26, 2016 (CN) .......................... 2016 1 0365302

(51) Int. Cl.
*G09G 3/36* (2006.01)
*H02H 7/12* (2006.01)
*H02H 9/04* (2006.01)
*H02M 3/156* (2006.01)
(Continued)

(52) U.S. Cl.
CPC ....... *H02H 7/1213* (2013.01); *G01R 31/2879* (2013.01); *G09G 3/36* (2013.01); *H02H 9/04* (2013.01); *H02M 3/156* (2013.01); *G02F 1/1333* (2013.01); *G09G 2330/04* (2013.01)

(58) Field of Classification Search
CPC .............. G09G 3/36; G09G 2330/026; G09G 2330/02; H02H 7/1213; H02H 9/04; G01R 31/28279
See application file for complete search history.

(56) References Cited

U.S. PATENT DOCUMENTS 5,587,683 A * 12/1996 Kawasaki ................ G09G 3/36
327/121
2009/0295775 A1* 12/2009 Kim .................... H05B 33/0815
345/212

(Continued)

*Primary Examiner* — Kevin M Nguyen
(74) *Attorney, Agent, or Firm* — Andrew C. Cheng (57) ABSTRACT

The DC voltage conversion circuit includes a booster circuit and a protection circuit. When the booster circuit is under EOS test, a detection circuit of the protection circuit obtains a second detection voltage from the voltage on the VGH line. A first adjustment circuit produces a third signal based on the comparison result of the second detection voltage and a reference voltage. A second adjustment circuit produces a fourth signal based on the comparison result of the second detection voltage and the reference voltage. The third and fourth signals adjust the equivalent resistances of a first and a second feedback circuits to a third and a forth equivalent resistances, respectively. Through the adjustment of the equivalent resistances of the first and second feedback circuits, the voltage of the VGH line is restored to that when no test signal is applied.

18 Claims, 3 Drawing Sheets

(51) Int. Cl.
    *G01R 31/28*     (2006.01)
    *G02F 1/1333*     (2006.01)

(56) References Cited

U.S. PATENT DOCUMENTS

2015/0277459 A1* 10/2015 Iwasa ........................ G05F 1/56
                                                                                   345/211
2016/0291626 A1* 10/2016 Tanaka ...................... G05F 3/02

* cited by examiner

FIG. 3 ical displayCROSS REFERENCE

This application claims the priority of Chinese Patent Application No. 201610365302.8, entitled "DC voltage conversion circuit and liquid crystal display device including the same", filed on May 26, 2016, the disclosure of which is incorporated herein by reference in its entirety.

FIELD OF THE INVENTION

The present disclosure relates to display technologies, and more particularly to a DC voltage conversion circuit and a liquid crystal display device employing the DC voltage conversion circuit.

BACKGROUND OF THE INVENTION

Liquid crystal display (LCD) devices are gaining widespread popularity due to their small form factors and low power consumption. A LCD device usually includes a circuit board, a backlight module, and a LCD panel. The circuit board drives the backlight module and the LCD panel. The backlight module provides illumination for the LCD panel. The LCD panel presents texts and images. The circuit board usually includes a DC voltage conversion circuit converting a first voltage into a second voltage, and providing the second voltage to the VGH line of the LCD device's Wire On Array (WOA). When conducting Electrical Over Stress (EOS) test on the DC voltage conversion circuit, the VGH line, components of the DC voltage conversion circuit, or components of the LCD device are often burnt down as the DC conversion circuit lacks proper protection mechanism.

SUMMARY OF THE INVENTION

The present disclosure teaches a DC voltage conversion circuit for a liquid crystal display (LCD) device. The DC voltage conversion circuit includes a booster circuit and a protection circuit. The booster circuit has a booster input terminal and a booster output terminal. The booster input terminal receives a first voltage, and the booster circuit converts the first voltage into a second voltage, and provides the second voltage to a VGH line of the LCD device through the booster output terminal. The protection circuit includes a detection circuit, a first feedback circuit, a first adjustment circuit, a second adjustment circuit, and a second feedback circuit. The first feedback circuit has an input terminal electrically connected to the booster output terminal, and an output terminal electrically connected a VGH line of the LCD device. The second feedback circuit has an end electrically connected to the booster output terminal and another end to ground.

When the booster circuit is not under Electrical Over Stress (EOS) test, the detection circuit detects the VGH line's voltage, and obtains a first detection voltage accordingly. The first detection voltage is output through an output terminal of the detection circuit. The first adjustment circuit compares the first detection voltage and a reference voltage, and produces a first signal based on the comparison result. The first signal is for adjusting an equivalent resistance of the first feedback circuit to a first equivalent resistance. The second adjustment circuit produces a second signal based on the first detection voltage. The second signal is for adjusting an equivalent resistance of the second feedback circuit to a second equivalent resistance.

When the booster circuit is under EOS test, test signal is applied to the booster output terminal. The detection circuit detects the VGH line's voltage, and obtains a second detection voltage accordingly. The second detection voltage is output through the output terminal of the detection circuit. The first adjustment circuit compares the second detection voltage and the reference voltage, and produces a third signal based on the comparison result. The third signal is for adjusting an equivalent resistance of the first feedback circuit to a third equivalent resistance. The second adjustment circuit produces a fourth signal based on the second detection voltage. The fourth signal is for adjusting an equivalent resistance of the second feedback circuit to a fourth equivalent resistance. When the first feedback circuit is adjusted to have the third equivalent resistance and the second feedback circuit is adjusted to have the fourth equivalent resistance, the voltage on the VGH line becomes the first detection voltage, the voltage on the VGH line becomes the first detection voltage.

The first feedback circuit includes a first feedback branch circuit, a second feedback branch circuit, and a third feedback branch circuit. The first adjustment circuit includes a first adjustment branch circuit, a second adjustment branch circuit, and a third adjustment branch circuit. The first adjustment branch circuit compares a voltage output from the detection circuit's output terminal and a first reference voltage, and produced a first adjustment signal based on the comparison result. The first adjustment signal is for adjusting the first feedback branch circuit's resistance. The second adjustment branch circuit compares the voltage output from the detection circuit's output terminal and a second reference voltage, and produced a second adjustment signal based on the comparison result. The second adjustment signal is for adjusting the second feedback branch circuit's resistance. The third adjustment branch circuit compares the voltage output from the detection circuit's output terminal and a third reference voltage, and produced a third adjustment signal based on the comparison result. The third adjustment signal is for adjusting the third feedback branch circuit's resistance. The first reference voltage is smaller than the second reference voltage, and the second reference voltage is smaller than the third reference voltage.

The first feedback branch circuit includes a first thin-film transistor (TFT) and a first resistor. The first TFT has its source electrically connected to the booster output terminal, its gate receiving the first adjustment signal, and its drain electrically connected to the VGH line through the first resistor. The first adjustment signal is for turning on or off the first TFT. The second feedback branch circuit includes a second TFT and a second resistor. The second TFT has its source electrically connected to the booster output terminal, its gate receiving the second adjustment signal, and its drain electrically connected to the VGH line through the second resistor. The second adjustment signal is for turning on or off the second TFT.

The third feedback branch circuit includes a third TFT and a third resistor. The third TFT has its source electrically connected to the booster output terminal, its gate receiving the third adjustment signal, and its drain electrically connected to the VGH line through the third resistor. The third adjustment signal is for turning on or off the third TFT.

The first adjustment branch circuit includes a first comparator whose non-inverting terminal is electrically connected to the output terminal of the detection circuit so as to receive the voltage output from the output terminal, and whose inverting terminal is applied with the first reference voltage. When the voltage received by the non-inverting terminal of the first comparator is greater than or equal to the first reference voltage, the first adjustment branch circuit 331 controls and turns off the first TFT. When the voltage received by the non-inverting terminal of the first comparator is smaller than the first reference voltage, the first adjustment branch circuit controls and turns on the first TFT.

The second adjustment branch circuit includes a second comparator whose non-inverting terminal is electrically connected to the output terminal of the detection circuit so as to receive the voltage output from the output terminal, and whose inverting terminal is applied with the second reference voltage. When the voltage received by the non-inverting terminal of the second comparator is greater than or equal to the second reference voltage, the second adjustment branch circuit controls and turns off the second TFT. When the voltage received by the non-inverting terminal of the second comparator is smaller than the second reference voltage, the second adjustment branch circuit controls and turns on the second TFT.

The third adjustment branch circuit includes a third comparator whose non-inverting terminal is electrically connected to the output terminal of the detection circuit so as to receive the voltage output from the output terminal, and whose inverting terminal is applied with the third reference voltage. When the voltage received by the non-inverting terminal of the third comparator is greater than or equal to the third reference voltage, the third adjustment branch circuit controls and turns off the third TFT. When the voltage received by the non-inverting terminal of the third comparator is smaller than the third reference voltage, the third adjustment branch circuit controls and turns on the third TFT.

The detection circuit includes a fourth resistor, a fifth resistor, and a photo coupler. The photo coupler has a first coupling input terminal, a second coupling input terminal, a first coupling output terminal, and a second coupling output terminal. The fourth resistor has an end as an input terminal of the detection circuit electrically connected to the VGH line, and the fourth resistor has another end electrically connected to the first coupling output terminal. The first coupling input terminal is electrically connected to the VGH line. The second coupling input terminal is electrically connected to the booster circuit. The second coupling output terminal is electrically connected to ground through the fifth resistor. A junction between the fifth resistor and the second coupling output terminal functions as the output terminal of the detection circuit.

The second feedback circuit includes a fourth feedback branch circuit, a fifth feedback branch circuit, and a sixth feedback branch circuit. The second adjustment circuit obtains a fourth adjustment signal, a fifth adjustment signal, and a sixth adjustment signal based on a voltage output from the output terminal of the detection circuit. The fourth adjustment signal is for adjusting the fourth feedback branch circuit's resistance. The fifth adjustment signal is for adjusting the fifth feedback branch circuit's resistance. The sixth adjustment signal is for adjusting the sixth feedback branch circuit's resistance. The fourth, fifth, and sixth adjustment signals jointly adjust the second feedback circuit's resistance.

The second adjustment circuit includes a multiplier and a controller. The multiplier has a first multiplier input terminal, a second multiplier input terminal, and a multiplier output terminal. The first multiplier input terminal is electrically connected to the output terminal of the detection circuit so as to receive the voltage output therefrom. The second multiplier input terminal is applied with a preset coefficient. The multiplier multiplies the voltage output from the detection circuit's output terminal with the preset coefficient, obtains a control signal, and outputs the control signal through the multiplier output terminal. The controller has a control signal input terminal, a first output terminal, a second output terminal, and a third output terminal. The control signal input terminal receives the control signal, and the controller produces the fourth, fifth, and sixth adjustment signals based on the control signal. The fourth adjustment signal is output from the first output terminal, the fifth adjustment signal is output from the second output terminal, and the sixth adjustment signal is output from the first output terminal.

The fourth feedback branch circuit includes a fourth TFT and a sixth resistor. The fifth feedback branch circuit includes a fifth TFT and a seventh resistor. The sixth feedback branch circuit includes a sixth TFT and an eighth resistor. The second feedback circuit further includes a seventh feedback branch circuit. The seventh feedback branch circuit includes a ninth resistor and a tenth resistor. The ninth resistor has an end electrically connected to the booster output terminal, and another end electrically connected to ground through the tenth resistor.

The gate of the fourth TFT receives the fourth adjustment signal for turning on or off the fourth TFT. The drain of the fourth TFT is electrically connected to a junction between the ninth and tenth resistors through the sixth resistor. The source of the fourth TFT is grounded.

The gate of the fifth TFT receives the fifth adjustment signal for turning on or off the fifth TFT. The drain of the fifth TFT is electrically connected to the junction between the ninth and tenth resistors through the seventh resistor. The source of the fourth TFT is grounded.

The gate of the sixth TFT receives the sixth adjustment signal for turning on or off the sixth TFT. The drain of the sixth TFT is electrically connected to the junction between the ninth and tenth resistors through the eighth resistor. The source of the sixth TFT is grounded.

The booster circuit includes a capacitor whose one end is electrically connected the booster output terminal and whose another end is grounded.

Compared to the prior art, when the booster circuit is under EOS test and test signal is applied to the booster output terminal, the detection circuit obtains the second detection voltage from the voltage on the VGH line. The first adjustment circuit produces the third signal based on the comparison result of the second detection voltage and the reference voltage. The second adjustment circuit produces the fourth signal based on the comparison result of the second detection voltage and the reference voltage. The third signal adjusts the equivalent resistance of the first feedback circuit to the third equivalent resistance. The fourth signal adjusts the equivalent resistance of the second feedback circuit to the fourth equivalent resistance. Through the adjustment of the equivalent resistances of the first and second feedback circuits, the voltage of the VGH line is restored to that when no test signal is applied, therefore avoiding the test signal damages the VGH line, components of the DC voltage conversion circuit, or components of the LCD device, when the booster circuit is under EOS test.

The present disclosure also teaches a LCD device including the above-described DC voltage conversion circuit.

BRIEF DESCRIPTION OF THE DRAWINGS

In order to more clearly illustrate the embodiments of the present disclosure or prior art, the following figures will be described in the embodiments are briefly introduced. It is obvious that the drawings are merely some embodiments of the present disclosure, those of ordinary skill in this field can obtain other figures according to these figures without paying the premise.

DETAILED DESCRIPTION OF PREFERRED EMBODIMENTS

Embodiments of the present disclosure are described in detail with the technical matters, structural features, achieved objects, and effects with reference to the accompanying drawings as follows. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

Figure 1:
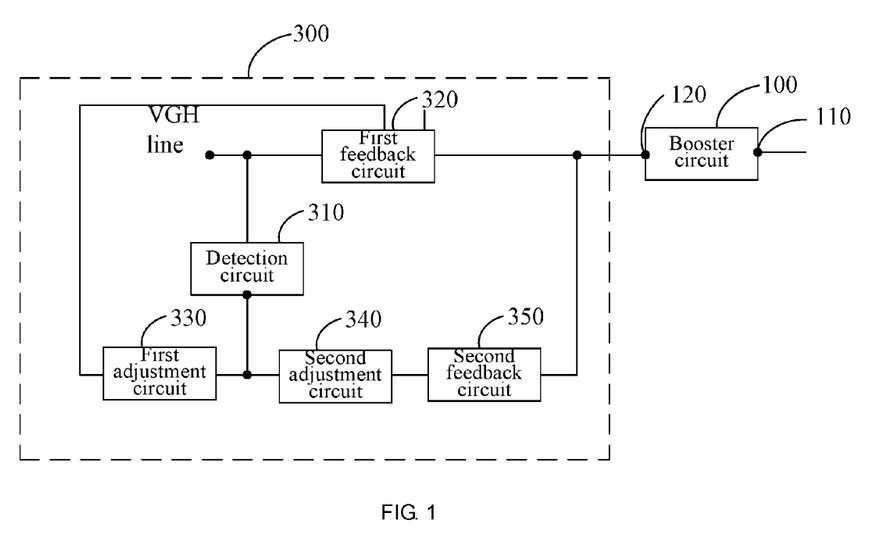
FIG. 1 is a functional block diagram showing a DC voltage conversion circuit according to an embodiment of the present disclosure.
Figure 2:
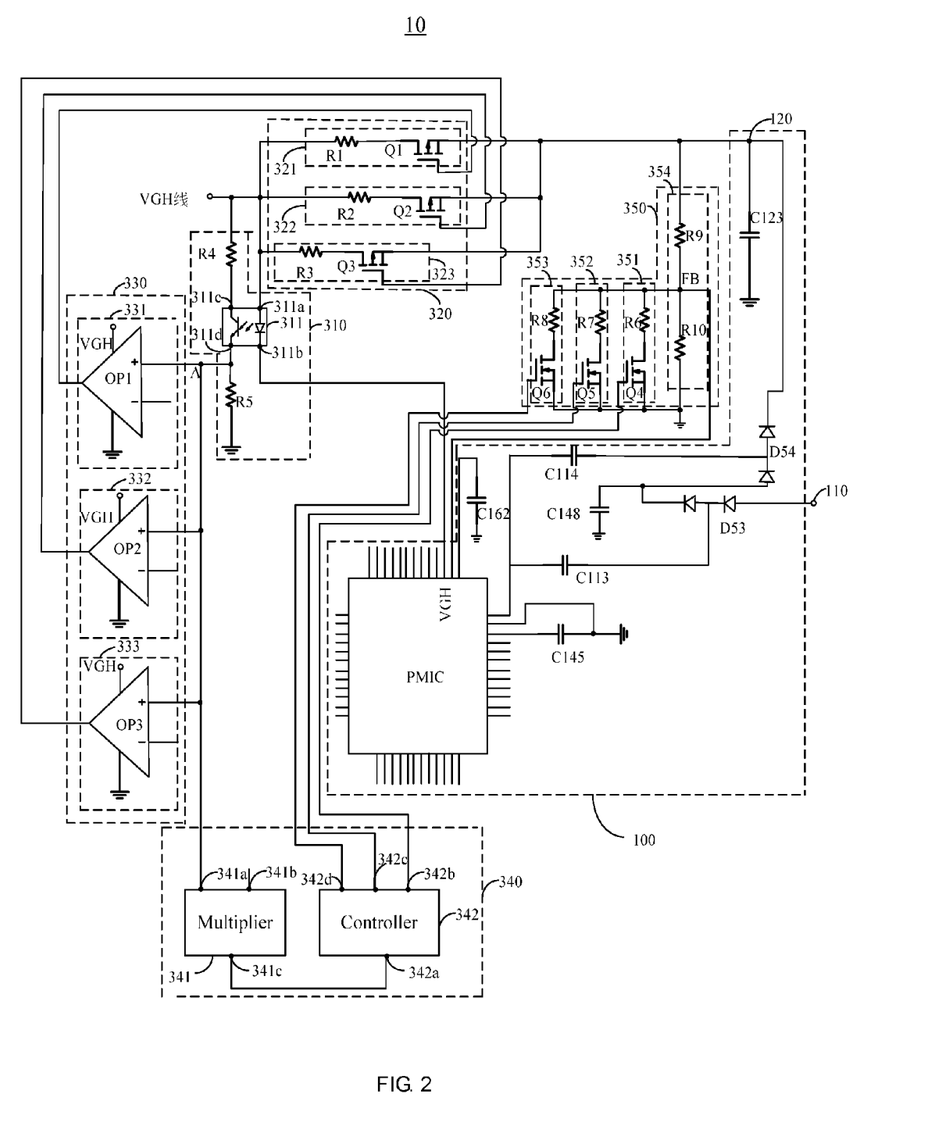
FIG. 2 is a circuit diagram showing the DC voltage conversion circuit of FIG. 1.

FIG. 1 is a functional block diagram showing a DC voltage conversion circuit according to an embodiment of the present disclosure. FIG. 2 is a circuit diagram showing the DC voltage conversion circuit of FIG. 1. As illustrated in FIGS. 1 and 2, the DC voltage conversion circuit 10 is applied to a liquid crystal display (LCD) device, and includes a booster circuit 100 and a protection circuit 300. The booster circuit 100 has a booster input terminal 110 and a booster output terminal 120. The booster input terminal 110 receives a first voltage. The booster circuit 100 converts the first voltage into a second voltage, and outputs the second voltage through the booster output terminal 120. The protection circuit 300 includes a detection circuit 310, a first feedback circuit 320, a first adjustment circuit 330, a second adjustment circuit 340, and a second feedback circuit 350. The first feedback circuit 320 has an input terminal electrically connected to the booster output terminal 120, and an output terminal electrically connected a VGH line of the LCD device. The second feedback circuit 350 has an end electrically connected to the booster output terminal 120 and another end to ground. When the booster circuit 100 is not under Electrical Over Stress (EOS) test, the detection circuit 310 detects the VGH line's voltage, and obtains a first detection voltage accordingly. The first detection voltage is output through an output terminal of the detection circuit 310. The first adjustment circuit 330 compares the first detection voltage and a reference voltage, and produces a first signal based on the comparison result. The first signal is for adjusting an equivalent resistance of the first feedback circuit 320 to a first equivalent resistance. The second adjustment circuit 340 produces a second signal based on the first detection voltage. The second signal is for adjusting an equivalent resistance of the second feedback circuit 340 to a second equivalent resistance.

When the booster circuit 100 is under EOS test, test signal is applied to the booster output terminal 120. The detection circuit 310 detects the VGH line's voltage, and obtains a second detection voltage accordingly. The second detection voltage is output through the output terminal of the detection circuit 310. The first adjustment circuit 330 compares the second detection voltage and the reference voltage, and produces a third signal based on the comparison result. The third signal is for adjusting an equivalent resistance of the first feedback circuit 320 to a third equivalent resistance. The second adjustment circuit 340 produces a fourth signal based on the second detection voltage. The fourth signal is for adjusting an equivalent resistance of the second feedback circuit 350 to a fourth equivalent resistance. When the first feedback circuit 320 is adjusted to have the third equivalent resistance and the second feedback circuit 350 is adjusted to have the fourth equivalent resistance, the voltage on the VGH line becomes the first detection voltage.

The so-called EOS test is to apply a voltage to a component under test greater than the rated working voltage of the component, or to apply a current to the component greater than the rated working current of the component, so as to test the component's performance.

The first feedback circuit 320 includes a first feedback branch circuit 321, a second feedback branch circuit 322, and a third feedback branch circuit 323. The first adjustment circuit 330 includes a first adjustment branch circuit 331, a second adjustment branch circuit 332, and a third adjustment branch circuit 333. The first adjustment branch circuit 331 compares a voltage output from the detection circuit 310's output terminal and a first reference voltage, and produced a first adjustment signal based on the comparison result. The first adjustment signal is for adjusting the first feedback branch circuit 321's resistance. The second adjustment branch circuit 332 compares the voltage output from the detection circuit 310's output terminal and a second reference voltage, and produced a second adjustment signal based on the comparison result. The second adjustment signal is for adjusting the second feedback branch circuit 322's resistance. The third adjustment branch circuit 333 compares the voltage output from the detection circuit 310's output terminal and a third reference voltage, and produced a third adjustment signal based on the comparison result. The third adjustment signal is for adjusting the third feedback branch circuit 323's resistance. The first reference voltage is smaller than the second reference voltage, and the second reference voltage is smaller than the third reference voltage.

The first feedback branch circuit 321 includes a first thin-film transistor (TFT) Q1 and a first resistor R1. The first TFT Q1 has its source electrically connected to the booster output terminal 120, its gate receiving the first adjustment signal, and its drain electrically connected to the VGH line through the first resistor R1. The first adjustment signal is for turning on or off the first TFT Q1. The second feedback branch circuit 322 includes a second TFT Q2 and a second resistor R2. The second TFT Q2 has its source electrically connected to the booster output terminal 120, its gate receiving the second adjustment signal, and its drain electrically connected to the VGH line through the second resistor R2. The second adjustment signal is for turning on or off the second TFT Q2. The third feedback branch circuit 323 includes a third TFT Q3 and a third resistor R3. The third TFT Q3 has its source electrically connected to the booster output terminal 120, its gate receiving the third adjustment signal, and its drain electrically connected to the VGH line through the third resistor R3. The third adjustment signal is for turning on or off the third TFT Q3.

In the present embodiment, the first, second, and third TFTs Q1, Q2 and Q3 and P-Type Metal Oxide Semiconductor (PMOS) TFTs. When the first adjustment signal is at a low level, the first TFT Q1 is turned on and, when the first adjustment signal is at a high level, the first TFT Q1 is turned off. When the second adjustment signal is at a low level, the second TFT Q2 is turned on and, when the second adjustment signal is at a high level, the second TFT Q2 is turned off. When the third adjustment signal is at a low level, the third TFT Q3 is turned on and, when the third adjustment signal is at a high level, the third TFT Q3 is turned off.

The first adjustment branch circuit 331 includes a first comparator OP1 whose non-inverting terminal is electrically connected to the output terminal of the detection circuit 310 so as to receive the voltage output from the output terminal, and whose inverting terminal is applied with the first reference voltage. When the voltage received by the non-inverting terminal of the first comparator OP1 is greater than or equal to the first reference voltage, the first adjustment branch circuit 331 controls and turns off the first TFT Q1. When the voltage received by the non-inverting terminal of the first comparator OP1 is smaller than the first reference voltage, the first adjustment branch circuit 331 controls and turns on the first TFT Q1.

The second adjustment branch circuit 332 includes a second comparator OP2 whose non-inverting terminal is electrically connected to the output terminal of the detection circuit 310 so as to receive the voltage output from the output terminal, and whose inverting terminal is applied with the second reference voltage. When the voltage received by the non-inverting terminal of the second comparator OP2 is greater than or equal to the second reference voltage, the second adjustment branch circuit 332 controls and turns off the second TFT Q2. When the voltage received by the non-inverting terminal of the second comparator OP2 is smaller than the second reference voltage, the second adjustment branch circuit 332 controls and turns on the second TFT Q2.

The third adjustment branch circuit 333 includes a third comparator OP3 whose non-inverting terminal is electrically connected to the output terminal of the detection circuit 310 so as to receive the voltage output from the output terminal, and whose inverting terminal is applied with the third reference voltage. When the voltage received by the non-inverting terminal of the third comparator OP3 is greater than or equal to the third reference voltage, the third adjustment branch circuit 333 controls and turns off the third TFT Q3. When the voltage received by the non-inverting terminal of the third comparator OP3 is smaller than the third reference voltage, the third adjustment branch circuit 333 controls and turns on the third TFT Q3.

The detection circuit 310 includes a fourth resistor R4, a fifth resistor R5, and a photo coupler 311. The photo coupler 311 has a first coupling input terminal 311a, a second coupling input terminal 311b, a first coupling output terminal 311c, and a second coupling output terminal 311d. The fourth resistor R4 has an end as an input terminal of the detection circuit 310 electrically connected to the VGH line, and the fourth resistor R4 has another end electrically connected to the first coupling output terminal 311c. The first coupling input terminal 311a is electrically connected to the VGH line. The second coupling input terminal 311b is electrically connected to the booster circuit 100. The second coupling output terminal 311d is electrically connected to ground through the fifth resistor R5. A junction A between the fifth resistor R5 and the second coupling output terminal 311d functions as the output terminal of the detection circuit 310.

The photo coupler 311 receives and converts the electrical signal from the first and second coupling input terminals 311a and 311b into an optical signal, and outputs the optical signal through the first and second coupling output terminals 311c and 311d. The signal output from the first and second coupling output terminals 311c and 311d is N times (N is a positive number) as large as that from the first and second coupling input terminals 311a and 311b. The photo coupler 311 prevents the interference between the electronic components connected with the first and second coupling input terminals 311a and 311b and those connected with the first and second coupling output terminals 311c and 311d, so as to enhance the precision of the protection circuit 300's overcurrent protection when conducting EOS test.

The second feedback circuit 350 includes a fourth feedback branch circuit 351, a fifth feedback branch circuit 352, and a sixth feedback branch circuit 353. The second adjustment circuit 340 obtains a fourth adjustment signal, a fifth adjustment signal, and a sixth adjustment signal based on a voltage output from the output terminal of the detection circuit 310. The fourth adjustment signal is for adjusting the fourth feedback branch circuit 351's resistance. The fifth adjustment signal is for adjusting the fifth feedback branch circuit 352's resistance. The sixth adjustment signal is for adjusting the sixth feedback branch circuit 353's resistance. The fourth, fifth, and sixth adjustment signals jointly adjust the second feedback circuit 350's resistance.

The second adjustment circuit 340 includes a multiplier 341 and a controller 342. The multiplier 341 has a first multiplier input terminal 341a, a second multiplier input terminal 341b, and a multiplier output terminal 341c. The first multiplier input terminal 341a is electrically connected to the output terminal of the detection circuit 310 so as to receive the voltage output therefrom. The second multiplier input terminal 341b is applied with a preset coefficient. The multiplier 341 multiplies the voltage output from the detection circuit 310's output terminal with the preset coefficient, obtains a control signal, and outputs the control signal through the multiplier output terminal 341c. The controller 342 has a control signal input terminal 342a, a first output terminal 342b, a second output terminal 342c, and a third output terminal 342d. The control signal input terminal 342a receives the control signal, and the controller 342 produces the fourth, fifth, and sixth adjustment signals based on the control signal. The fourth adjustment signal is output from the first output terminal 342b, the fifth adjustment signal is output from the second output terminal 342c, and the sixth adjustment signal is output from the first output terminal 342d.

The fourth feedback branch circuit 351 includes a fourth TFT Q4 and a sixth resistor R6. The fifth feedback branch circuit 352 includes a fifth TFT Q5 and a seventh resistor R7. The sixth feedback branch circuit 353 includes a sixth TFT Q6 and an eighth resistor R8. The second feedback circuit 350 further includes a seventh feedback branch circuit 354. The seventh feedback branch circuit 354 includes a ninth resistor R9 and a tenth resistor R10. The ninth resistor R9 has an end electrically connected to the booster output terminal 120, and another end electrically connected to ground through the tenth resistor R10.

The gate of the fourth TFT Q4 receives the fourth adjustment signal for turning on or off the fourth TFT Q4. The drain of the fourth TFT Q4 is electrically connected to a junction FB between the ninth and tenth resistors R9 and R10 through the sixth resistor R6. The source of the fourth TFT Q4 is grounded.

The gate of the fifth TFT Q5 receives the fifth adjustment signal for turning on or off the fifth TFT Q5. The drain of the fifth TFT Q5 is electrically connected to the junction FB between the ninth and tenth resistors R9 and R10 through the seventh resistor R7. The source of the fourth TFT Q4 is grounded.

The gate of the sixth TFT Q6 receives the sixth adjustment signal for turning on or off the sixth TFT Q6. The drain of the sixth TFT Q6 is electrically connected to the junction FB between the ninth and tenth resistors R9 and R10 through the eighth resistor R8. The source of the sixth TFT Q6 is grounded.

In the present embodiment, the fourth, fifth, and sixth TFTs Q4, Q5, and Q6 are NMOS TFTs. When the fourth adjustment signal is at a high level, the fourth TFT Q4 is turned on and, when the fourth adjustment signal is at a low level, the fourth TFT Q4 is turned off. When the fifth adjustment signal is at a high level, the fifth TFT Q5 is turned on and, when the fifth adjustment signal is at a low level, the fifth TFT Q5 is turned off. When the sixth adjustment signal is at a high level, the sixth TFT Q6 is turned on and, when the sixth adjustment signal is at a low level, the sixth TFT Q6 is turned off.

The booster circuit 100 includes a capacitor C123 whose one end is electrically connected the booster output terminal 120 and whose another end is grounded. The capacitor C123 is for filtering the second voltage output from the booster output terminal 120 so that the second voltage has a smooth waveform.

The operation of the DC voltage conversion circuit is described as follows. When the booster circuit 100 is not under EOS test, the current flowing through a VGH terminal of a Power Management IC (PMIC) of the booster circuit 100 or through the VGH line is small. Let VA represent the voltage at the junction A between the fifth resistor R5 and the second coupling output terminal 311d, Vref1 represent the first reference voltage, Vref2 represent the second reference voltage, and Vref3 represent the third reference voltage. Then, at this moment, VA<Vref1<Vref2<Vref3, the first comparator OP1 produces a low-level signal from comparing VA and Vref1, the second comparator OP2 produces a low-level signal from comparing VA and Vref2, and the third comparator OP3 produces a low-level signal from comparing VA and Vref3. The first, second, and third TFTs Q1, Q2, and Q3 are turned on. An equivalent resistance of the first feedback circuit 320 is the first equivalent resistance Req1 which is equal to the resistance of parallel-connected R1, R2, and R3 (or R1//R2//R3 where "//" represents parallel connection). If the current of the first feedback circuit 320 is represented as I1, the voltage drop over the first feedback circuit 320 is I1*Req1. Let VFB represent the voltage at the junction FB between the ninth and tenth resistors R9 and R10, VGHF represent the voltage at the booster output terminal 120 of the booster circuit 100, and $V_{GH}$ represent the voltage on the VGH line. Then, VGHF=VFB*(1+R9/R10), $V_{GH}$=VGHF-I1*Req1=VFB*(1+R9/R10)-I1*(R1//R2//R3).

When the booster circuit 100 is under EOS test, the current flowing through the VGH terminal of the PMIC of the booster circuit 100 or through the VGH line is increased. Then, assuming that, at this moment, Vref1<Vref2<VA<Vref3, the first comparator OP1 produces a high-level signal from comparing VA and Vref1, the second comparator OP2 produces a high-level signal from comparing VA and Vref2, and the third comparator OP3 produces a low-level signal from comparing VA and Vref3. The first and third TFTs Q1 and Q2 are turned off, and third TFT Q3 is turned on. The equivalent resistance of the first feedback circuit 320 is equal to the third equivalent resistance Req3 which is equal to the resistance of R3. At this moment, the fourth adjustment signal output from the second adjustment circuit 340 is high-level, the fifth adjustment signal is high-level, the sixth adjustment signal is low-level, and VGHF=VFB*[1+R9/(R10//R6//R7)]. Therefore, VGHF under EOS test is greater than VGHF not under EOS test. On the other hand, $V_{GH}$=VGHF-I1*R3=VFB*[1+R9/(R10//R6//R7)]-I1*R3=VFB*(1+R9/R10)-I1*(R1//R2//R3), and the voltage on VGH line under EOS test is equal to that on the VGH line not under EOS test.

Compared to the prior art, when the booster circuit 100 is under EOS test and test signal is applied to the booster output terminal 120, the detection circuit 310 obtains the second detection voltage from the voltage on the VGH line. The first adjustment circuit 330 produces the third signal based on the comparison result of the second detection voltage and the reference voltage. The second adjustment circuit 340 produces the fourth signal based on the comparison result of the second detection voltage and the reference voltage. The third signal adjusts the equivalent resistance of the first feedback circuit 320 to the third equivalent resistance. The fourth signal adjusts the equivalent resistance of the second feedback circuit 350 to the fourth equivalent resistance. Through the adjustment of the equivalent resistances of the first and second feedback circuits 320 and 350, the voltage of the VGH line is restored to that when no test signal is applied, therefore avoiding the test signal damages the VGH line, components of the DC voltage conversion circuit, or components of the LCD device, when the booster circuit 100 is under EOS test.

Figure 3:
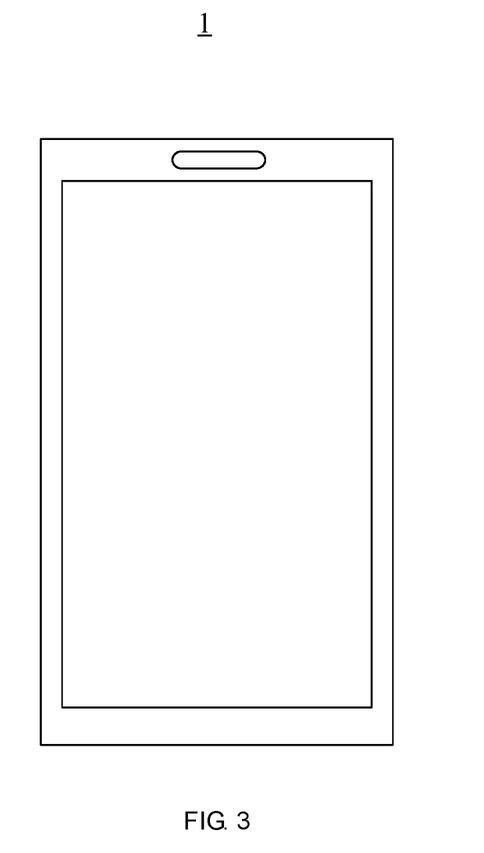
FIG. 3 is a schematic diagram showing the structure of a liquid crystal display (LCD) device according to an embodiment of the present disclosure.

The present disclosure also teaches a LCD device 1 as shown in FIG. 3, which is a schematic diagram showing the structure of the LCD device 1. The LCD device 1 includes the above-described DC voltage conversion circuit whose details are omitted here. In the present embodiment, the LCD device 1 may be, but not limited to, a smart phone, a mobile internet device (MID), an electronic book reader, a tablet computer, a Play Station Portable (PSP), a Personal Digital Assistance (PDA), etc.

Above are embodiments of the present disclosure, which does not limit the scope of the present disclosure. Any modifications, equivalent replacements or improvements within the spirit and principles of the embodiment described above should be covered by the protected scope of the disclosure.

What is claimed is:

1. A DC voltage conversion circuit for a liquid crystal display (LCD) device, comprising
   a booster circuit having a booster input terminal and a booster output terminal, where the booster input terminal receives a first voltage, and the booster circuit converts the first voltage into a second voltage, and provides the second voltage to a VGH line of the LCD device through the booster output terminal; and
   a protection circuit comprising a detection circuit, a first feedback circuit, a first adjustment circuit, a second adjustment circuit, and a second feedback circuit, where the first feedback circuit has an input terminal electrically connected to the booster output terminal, and an output terminal electrically connected a VGH line of the LCD device, the second feedback circuit has an end electrically connected to the booster output terminal and another end to ground;
   wherein, when the booster circuit is not under Electrical Over Stress (EOS) test, the detection circuit detects the VGH line's voltage, and obtains a first detection voltage accordingly; the first detection voltage is output through an output terminal of the detection circuit; the first adjustment circuit compares the first detection voltage and a reference voltage, and produces a first signal based on the comparison result; the first signal is for adjusting an equivalent resistance of the first feedback circuit to a first equivalent resistance; the second adjustment circuit produces a second signal based on the first detection voltage; the second signal is for adjusting an equivalent resistance of the second feedback circuit to a second equivalent resistance;

when the booster circuit is under EOS test, test signal is applied to the booster output terminal; the detection circuit detects the VGH line's voltage, and obtains a second detection voltage accordingly; the second detection voltage is output through the output terminal of the detection circuit; the first adjustment circuit compares the second detection voltage and the reference voltage, and produces a third signal based on the comparison result; the third signal is for adjusting an equivalent resistance of the first feedback circuit to a third equivalent resistance; the second adjustment circuit produces a fourth signal based on the second detection voltage; the fourth signal is for adjusting an equivalent resistance of the second feedback circuit to a fourth equivalent resistance;

when the first feedback circuit is adjusted to have the third equivalent resistance and the second feedback circuit is adjusted to have the fourth equivalent resistance, the voltage on the VGH line becomes the first detection voltage.

2. The DC voltage conversion circuit according to claim 1, wherein the first feedback circuit comprises a first feedback branch circuit, a second feedback branch circuit, and a third feedback branch circuit; the first adjustment circuit comprises a first adjustment branch circuit, a second adjustment branch circuit, and a third adjustment branch circuit; the first adjustment branch circuit compares a voltage output from the detection circuit's output terminal and a first reference voltage, and produced a first adjustment signal based on the comparison result; the first adjustment signal is for adjusting the first feedback branch circuit's resistance; the second adjustment branch circuit compares the voltage output from the detection circuit's output terminal and a second reference voltage, and produced a second adjustment signal based on the comparison result; the second adjustment signal is for adjusting the second feedback branch circuit's resistance; the third adjustment branch circuit compares the voltage output from the detection circuit's output terminal and a third reference voltage, and produced a third adjustment signal based on the comparison result; the third adjustment signal is for adjusting the third feedback branch circuit's resistance; the first reference voltage is smaller than the second reference voltage, and the second reference voltage is smaller than the third reference voltage.

3. The DC voltage conversion circuit according to claim 2, wherein the first feedback branch circuit comprises a first thin-film transistor (TFT) and a first resistor; the first TFT has its source electrically connected to the booster output terminal, its gate receiving the first adjustment signal, and its drain electrically connected to the VGH line through the first resistor; the first adjustment signal is for turning on or off the first TFT;

the second feedback branch circuit comprises a second TFT and a second resistor; the second TFT has its source electrically connected to the booster output terminal, its gate receiving the second adjustment signal, and its drain electrically connected to the VGH line through the second resistor; the second adjustment signal is for turning on or off the second TFT; and the third feedback branch circuit comprises a third TFT and a third resistor; the third TFT has its source electrically connected to the booster output terminal, its gate receiving the third adjustment signal, and its drain electrically connected to the VGH line through the third resistor; the third adjustment signal is for turning on or off the third TFT.

4. The DC voltage conversion circuit according to claim 3, wherein the first adjustment branch circuit comprises a first comparator whose non-inverting terminal is electrically connected to the output terminal of the detection circuit so as to receive the voltage output from the output terminal, and whose inverting terminal is applied with the first reference voltage; When the voltage received by the non-inverting terminal of the first comparator is greater than or equal to the first reference voltage, the first adjustment branch circuit controls and turns off the first TFT; when the voltage received by the non-inverting terminal of the first comparator is smaller than the first reference voltage, the first adjustment branch circuit controls and turns on the first TFT;

the second adjustment branch circuit comprises a second comparator whose non-inverting terminal is electrically connected to the output terminal of the detection circuit so as to receive the voltage output from the output terminal, and whose inverting terminal is applied with the second reference voltage; when the voltage received by the non-inverting terminal of the second comparator is greater than or equal to the second reference voltage, the second adjustment branch circuit controls and turns off the second TFT; when the voltage received by the non-inverting terminal of the second comparator is smaller than the second reference voltage, the second adjustment branch circuit controls and turns on the second TFT;

the third adjustment branch circuit comprises a third comparator whose non-inverting terminal is electrically connected to the output terminal of the detection circuit so as to receive the voltage output from the output terminal, and whose inverting terminal is applied with the third reference voltage; when the voltage received by the non-inverting terminal of the third comparator is greater than or equal to the third reference voltage, the third adjustment branch circuit controls and turns off the third TFT; when the voltage received by the non-inverting terminal of the third comparator is smaller than the third reference voltage, the third adjustment branch circuit controls and turns on the third TFT.

5. The DC voltage conversion circuit according to claim 1, wherein the detection circuit includes a fourth resistor, a fifth resistor, and a photo coupler; the photo coupler has a first coupling input terminal, a second coupling input terminal, a first coupling output terminal, and a second coupling output terminal; the fourth resistor has an end as an input terminal of the detection circuit electrically connected to the VGH line; the fourth resistor has another end electrically connected to the first coupling output terminal; the first coupling input terminal is electrically connected to the VGH line; the second coupling input terminal is electrically connected to the booster circuit; the second coupling output terminal is electrically connected to ground through the fifth resistor; a junction between the fifth resistor and the second coupling output terminal functions as the output terminal of the detection circuit.

6. The DC voltage conversion circuit according to claim 1, wherein the second feedback circuit comprises a fourth feedback branch circuit, a fifth feedback branch circuit, and a sixth feedback branch circuit; the second adjustment circuit obtains a fourth adjustment signal, a fifth adjustment signal, and a sixth adjustment signal based on a voltage output from the output terminal of the detection circuit; the fourth adjustment signal is for adjusting the fourth feedback branch circuit's resistance; the fifth adjustment signal is for adjusting the fifth feedback branch circuit's resistance; the sixth adjustment signal is for adjusting the sixth feedback branch circuit's resistance; the fourth, fifth, and sixth adjustment signals jointly adjust the second feedback circuit's resistance.

7. The DC voltage conversion circuit according to claim 6, wherein the second adjustment circuit comprises a multiplier and a controller; the multiplier has a first multiplier input terminal, a second multiplier input terminal, and a multiplier output terminal; the first multiplier input terminal is electrically connected to the output terminal of the detection circuit so as to receive the voltage output therefrom; the second multiplier input terminal is applied with a preset coefficient; the multiplier multiplies the voltage output from the detection circuit's output terminal with the preset coefficient, obtains a control signal, and outputs the control signal through the multiplier output terminal; the controller has a control signal input terminal, a first output terminal, a second output terminal, and a third output terminal; the control signal input terminal receives the control signal, and the controller produces the fourth, fifth, and sixth adjustment signals based on the control signal; the fourth adjustment signal is output from the first output terminal, the fifth adjustment signal is output from the second output terminal, and the sixth adjustment signal is output from the first output terminal.

8. The DC voltage conversion circuit according to claim 6, wherein the fourth feedback branch circuit comprises a fourth TFT and a sixth resistor; the fifth feedback branch circuit comprises a fifth TFT and a seventh resistor; the sixth feedback branch circuit comprises a sixth TFT and an eighth resistor; the second feedback circuit further comprises a seventh feedback branch circuit; the seventh feedback branch circuit comprises a ninth resistor and a tenth resistor; the ninth resistor has an end electrically connected to the booster output terminal, and another end electrically connected to ground through the tenth resistor;

the gate of the fourth TFT receives the fourth adjustment signal for turning on or off the fourth TFT; the drain of the fourth TFT is electrically connected to a junction between the ninth and tenth resistors through the sixth resistor; the source of the fourth TFT is grounded;

the gate of the fifth TFT receives the fifth adjustment signal for turning on or off the fifth TFT; the drain of the fifth TFT is electrically connected to the junction between the ninth and tenth resistors through the seventh resistor; the source of the fourth TFT is grounded;

the gate of the sixth TFT receives the sixth adjustment signal for turning on or off the sixth TFT; the drain of the sixth TFT is electrically connected to the junction between the ninth and tenth resistors through the eighth resistor; the source of the sixth TFT is grounded.

9. The DC voltage conversion circuit according to claim 8, wherein the booster circuit comprises a capacitor whose one end is electrically connected the booster output terminal and whose another end is grounded.

10. A liquid crystal display (LCD) device, comprising a DC voltage conversion circuit, wherein the DC voltage conversion circuit comprises:

a booster circuit having a booster input terminal and a booster output terminal, where the booster input terminal receives a first voltage, and the booster circuit converts the first voltage into a second voltage, and provides the second voltage to a VGH line of the LCD device through the booster output terminal; and a protection circuit comprising a detection circuit, a first feedback circuit, a first adjustment circuit, a second adjustment circuit, and a second feedback circuit, where the first feedback circuit has an input terminal electrically connected to the booster output terminal, and an output terminal electrically connected a VGH line of the LCD device, the second feedback circuit has an end electrically connected to the booster output terminal and another end to ground;

when the booster circuit is not under Electrical Over Stress (EOS) test, the detection circuit detects the VGH line's voltage, and obtains a first detection voltage accordingly; the first detection voltage is output through an output terminal of the detection circuit; the first adjustment circuit compares the first detection voltage and a reference voltage, and produces a first signal based on the comparison result; the first signal is for adjusting an equivalent resistance of the first feedback circuit to a first equivalent resistance; the second adjustment circuit produces a second signal based on the first detection voltage; the second signal is for adjusting an equivalent resistance of the second feedback circuit to a second equivalent resistance;

when the booster circuit is under EOS test, test signal is applied to the booster output terminal; the detection circuit detects the VGH line's voltage, and obtains a second detection voltage accordingly; the second detection voltage is output through the output terminal of the detection circuit; the first adjustment circuit compares the second detection voltage and the reference voltage, and produces a third signal based on the comparison result; the third signal is for adjusting an equivalent resistance of the first feedback circuit to a third equivalent resistance; the second adjustment circuit produces a fourth signal based on the second detection voltage; the fourth signal is for adjusting an equivalent resistance of the second feedback circuit to a fourth equivalent resistance;

when the first feedback circuit is adjusted to have the third equivalent resistance and the second feedback circuit is adjusted to have the fourth equivalent resistance, the voltage on the VGH line becomes the first detection voltage.

11. The LCD device according to claim 10, wherein the first feedback circuit comprises a first feedback branch circuit, a second feedback branch circuit, and a third feedback branch circuit; the first adjustment circuit comprises a first adjustment branch circuit, a second adjustment branch circuit, and a third adjustment branch circuit; the first adjustment branch circuit compares a voltage output from the detection circuit's output terminal and a first reference voltage, and produced a first adjustment signal based on the comparison result; the first adjustment signal is for adjusting the first feedback branch circuit's resistance; the second adjustment branch circuit compares the voltage output from the detection circuit's output terminal and a second reference voltage, and produced a second adjustment signal based on the comparison result; the second adjustment signal is for adjusting the second feedback branch circuit's resistance; the third adjustment branch circuit compares the voltage output from the detection circuit's output terminal and a third reference voltage, and produced a third adjustment signal based on the comparison result; the third adjustment signal is for adjusting the third feedback branch circuit's resistance; the first reference voltage is smaller than the second reference voltage, and the second reference voltage is smaller than the third reference voltage.

12. The LCD device according to claim 11, wherein the first feedback branch circuit comprises a first thin-film transistor (TFT) and a first resistor; the first TFT has its source electrically connected to the booster output terminal, its gate receiving the first adjustment signal, and its drain electrically connected to the VGH line through the first resistor; the first adjustment signal is for turning on or off the first TFT;

the second feedback branch circuit comprises a second TFT and a second resistor; the second TFT has its source electrically connected to the booster output terminal, its gate receiving the second adjustment signal, and its drain electrically connected to the VGH line through the second resistor; the second adjustment signal is for turning on or off the second TFT; and the third feedback branch circuit comprises a third TFT and a third resistor; the third TFT has its source electrically connected to the booster output terminal, its gate receiving the third adjustment signal, and its drain electrically connected to the VGH line through the third resistor; the third adjustment signal is for turning on or off the third TFT.

13. The LCD device according to claim 12, wherein the first adjustment branch circuit comprises a first comparator whose non-inverting terminal is electrically connected to the output terminal of the detection circuit so as to receive the voltage output from the output terminal, and whose inverting terminal is applied with the first reference voltage; When the voltage received by the non-inverting terminal of the first comparator is greater than or equal to the first reference voltage, the first adjustment branch circuit controls and turns off the first TFT; when the voltage received by the non-inverting terminal of the first comparator is smaller than the first reference voltage, the first adjustment branch circuit controls and turns on the first TFT;

the second adjustment branch circuit comprises a second comparator whose non-inverting terminal is electrically connected to the output terminal of the detection circuit so as to receive the voltage output from the output terminal, and whose inverting terminal is applied with the second reference voltage; when the voltage received by the non-inverting terminal of the second comparator is greater than or equal to the second reference voltage, the second adjustment branch circuit controls and turns off the second TFT; when the voltage received by the non-inverting terminal of the second comparator is smaller than the second reference voltage, the second adjustment branch circuit controls and turns on the second TFT;

the third adjustment branch circuit comprises a third comparator whose non-inverting terminal is electrically connected to the output terminal of the detection circuit so as to receive the voltage output from the output terminal, and whose inverting terminal is applied with the third reference voltage; when the voltage received by the non-inverting terminal of the third comparator is greater than or equal to the third reference voltage, the third adjustment branch circuit controls and turns off the third TFT; when the voltage received by the non-inverting terminal of the third comparator is smaller than the third reference voltage, the third adjustment branch circuit controls and turns on the third TFT.

14. The LCD device according to claim 10, wherein the detection circuit includes a fourth resistor, a fifth resistor, and a photo coupler; the photo coupler has a first coupling input terminal, a second coupling input terminal, a first coupling output terminal, and a second coupling output terminal; the fourth resistor has an end as an input terminal of the detection circuit electrically connected to the VGH line; the fourth resistor has another end electrically connected to the first coupling output terminal; the first coupling input terminal is electrically connected to the VGH line; the second coupling input terminal is electrically connected to the booster circuit; the second coupling output terminal is electrically connected to ground through the fifth resistor; a junction between the fifth resistor and the second coupling output terminal functions as the output terminal of the detection circuit.

15. The LCD device according to claim 10, wherein the second feedback circuit comprises a fourth feedback branch circuit, a fifth feedback branch circuit, and a sixth feedback branch circuit; the second adjustment circuit obtains a fourth adjustment signal, a fifth adjustment signal, and a sixth adjustment signal based on a voltage output from the output terminal of the detection circuit; the fourth adjustment signal is for adjusting the fourth feedback branch circuit's resistance; the fifth adjustment signal is for adjusting the fifth feedback branch circuit's resistance; the sixth adjustment signal is for adjusting the sixth feedback branch circuit's resistance; the fourth, fifth, and sixth adjustment signals jointly adjust the second feedback circuit's resistance.

16. The LCD device according to claim 15, wherein the second adjustment circuit comprises a multiplier and a controller; the multiplier has a first multiplier input terminal, a second multiplier input terminal, and a multiplier output terminal; the first multiplier input terminal is electrically connected to the output terminal of the detection circuit so as to receive the voltage output therefrom; the second multiplier input terminal is applied with a preset coefficient; the multiplier multiplies the voltage output from the detection circuit's output terminal with the preset coefficient, obtains a control signal, and outputs the control signal through the multiplier output terminal; the controller has a control signal input terminal, a first output terminal, a second output terminal, and a third output terminal; the control signal input terminal receives the control signal, and the controller produces the fourth, fifth, and sixth adjustment signals based on the control signal; the fourth adjustment signal is output from the first output terminal, the fifth adjustment signal is output from the second output terminal, and the sixth adjustment signal is output from the first output terminal.

17. The LCD device according to claim 15, wherein the fourth feedback branch circuit comprises a fourth TFT and a sixth resistor; the fifth feedback branch circuit comprises a fifth TFT and a seventh resistor; the sixth feedback branch circuit comprises a sixth TFT and an eighth resistor; the second feedback circuit further comprises a seventh feedback branch circuit; the seventh feedback branch circuit comprises a ninth resistor and a tenth resistor; the ninth resistor has an end electrically connected to the booster output terminal, and another end electrically connected to ground through the tenth resistor;

the gate of the fourth TFT receives the fourth adjustment signal for turning on or off the fourth TFT; the drain of the fourth TFT is electrically connected to a junction between the ninth and tenth resistors through the sixth resistor; the source of the fourth TFT is grounded;

the gate of the fifth TFT receives the fifth adjustment signal for turning on or off the fifth TFT; the drain of the fifth TFT is electrically connected to the junction between the ninth and tenth resistors through the seventh resistor; the source of the fourth TFT is grounded;

the gate of the sixth TFT receives the sixth adjustment signal for turning on or off the sixth TFT; the drain of the sixth TFT is electrically connected to the junction between the ninth and tenth resistors through the eighth resistor; the source of the sixth TFT is grounded.

18. The LCD device according to claim 17, wherein the booster circuit comprises a capacitor whose one end is electrically connected the booster output terminal and whose another end is grounded.

* * * * *